United States Patent [19]
Hirakawa

[11] Patent Number: 6,026,015
[45] Date of Patent: Feb. 15, 2000

[54] NON-VOLATILE MULTI-LEVEL SEMICONDUCTOR STORAGE DEVICE FOR STORING MULTIPLE BITS USING MULTIPLE VARIABLE THRESHOLD VOLTAGES

[75] Inventor: Tsuyoshi Hirakawa, Tokyo, Japan

[73] Assignee: NEC Corporation, Tokyo, Japan

[21] Appl. No.: 09/105,268

[22] Filed: Jun. 26, 1998

[30] Foreign Application Priority Data

Jun. 27, 1997 [JP] Japan .................................. 9-187808

[51] Int. Cl.[7] ................................................ G11C 11/34
[52] U.S. Cl. ................................. 365/185.03; 365/185.24
[58] Field of Search ........................ 365/185.03, 185.24, 365/185.29

[56] References Cited

U.S. PATENT DOCUMENTS 5,815,434  9/1998  Hasbun et al. .................... 365/185.03
5,815,436  9/1998  Tanaka et al. .................... 365/185.03

*Primary Examiner*—David Nelms
*Assistant Examiner*—Hoai V. Ho
*Attorney, Agent, or Firm*—Sughrue, Mion, Zinn, Macpeak & Seas, PLLC

[57] ABSTRACT

A non-volatile multi-level semiconductor storage device having a memory cell that stores m or more bits (m>2) of data and is responsive to n different levels (n>4) of threshold voltage during a write operation. The different thresholds may be achieved by raising and/or lowering the voltage. In order to permit compatibility with a binary collation judgment in overwriting, the cell is operative, when a write data "1" is to be written in the memory cell, such that when a k bit of m bits ($1 \leq k \leq m$) in a pre-write data has a "0", the write data is converted into data "0". The conversion may be accomplished by using a write data "1" and an output signal of a sense amplifier.

10 Claims, 11 Drawing Sheets

100; P-TYPE SILICON SUBSTRATE
101; DRAIN
102; SOURCE
103; CHANNEL REGION
104; TUNNEL INSULATING FILM
105; FLOATING GATE
106; INTERLAYER INSULATING FILM
107; CONTROL GATE
108; BIT LINE
109; SOURCE LINE

FIG.5 PRIOR ART

| PRE-WRITE DATA (READ-OUT DATA) | WRITE DATA | COMPARISON RESULT JUDGEMENT |
|---|---|---|
| 0(WRITE STATE VT HIGH) | 0 | PASS(H) |
| 0(WRITE STATE VT HIGH) | 1 | PASS(H) |
| 1(ERASE STATE VT LOW) | 0 | FAIL(L):WRITE UP TO "0" |
| 1(ERASE STATE VT LOW) | 1 | PASS(H) |

FIG.7 PRIOR ART

| PRE-WRITE DATA (READ-OUT DATA) | WRITE DATA | COMPARISON RESULT JUDGEMENT |
|---|---|---|
| 0 (WRITE STATE VT HIGH) | 0 | PASS(H) |
| 0 (WRITE STATE VT HIGH) | 1 | WRITE ERROR |
| 1 (ERASE STATE VT LOW) | 0 | FAIL(L):WRITE UP TO "0" |
| 1 (ERASE STATE VT LOW) | 1 | PASS(H) |

FIG.9 PRIOR ART

| PRE-WRITE DATA (READ-OUT DATA) | WRITE DATA | | | |
|---|---|---|---|---|
| | "11" WRITE | "10" WRITE | "01" WRITE | "00" WRITE |
| "11" *1 INITIAL COMPARISON RESULT | PRE-WRITE VERIFY PASS PASS(H) | WRITE UP TO "10" FAIL(L) | WRITE UP TO "01" FAIL(L) | WRITE UP TO "00" FAIL(L) |
| "10" *1 INITIAL COMPARISON RESULT | PRE-WRITE VERIFY PASS PASS(H) | PRE-WRITE VERIFY PASS PASS(H) | POST-WRITE DATA→"01" *2 FAIL(L) | WRITE UP TO "00" FAIL(L) |
| "01" *1 INITIAL COMPARISON RESULT | PRE-WRITE VERIFY PASS PASS(H) | POST-WRITE DATA→"00" *3 FAIL(L) | PRE-WRITE VERIFY PASS PASS(H) | WRITE UP TO "00" FAIL(L) |
| "00" *1 INITIAL COMPARISON RESULT | PRE-WRITE VERIFY PASS PASS(H) | PRE-WRITE VERIFY PASS PASS(H) | PRE-WRITE VERIFY PASS PASS(H) | PRE-WRITE VERIFY PASS PASS(H) |

*1 REFER TO THRESHOLD VOLTAGE DISTRIBUTION IN FIG.8

*2 NOT IDENTICAL WITH EXPECTED VALUE "00"

*3 IDENTICAL WITH EXPECTED VALUE

FIG.11

| PRE-WRITE DATA (READ-OUT DATA) | "11" WRITE POST-CONVERT WD | "10" WRITE POST-CONVERT WD | "01" WRITE POST-CONVERT WD | "00" WRITE POST-CONVERT WD |
|---|---|---|---|---|
| "11" *1 INITIAL COMPARISON RESULT | PRE-WRITE VERIFY PASS PASS(H),WD="11" | WRITE UP TO "10" FAIL(L),WD="10" | WRITE UP TO "01" FAIL(L),WD="01" | WRITE UP TO "00" FAIL(L),WD="00" |
| "10" *1 INITIAL COMPARISON RESULT | PRE-WRITE VERIFY PASS PASS(H),WD="10" | PRE-WRITE VERIFY PASS PASS(H),WD="10" | POST-WRITE DATA→"01" FAIL(L)*2,WD="00" | WRITE UP TO "00" FAIL(L),WD="00" |
| "01" *1 INITIAL COMPARISON RESULT | PRE-WRITE VERIFY PASS PASS(H),WD="01" | POST-WRITE DATA→"01" FAIL(L)*2,WD="00" | PRE-WRITE VERIFY PASS PASS(H),WD="01" | WRITE UP TO "00" FAIL(L),WD="00" |
| "00" *1 INITIAL COMPARISON RESULT | PRE-WRITE VERIFY PASS PASS(H),WD="00" | PRE-WRITE VERIFY PASS PASS(H),WD="00" | PRE-WRITE VERIFY PASS PASS(H),WD="00" | PRE-WRITE VERIFY PASS PASS(H),WD="00" |

*1 REFER TO THRESHOLD VOLTAGE DISTRIBUTION IN FIG.8

*2 IDENTICAL WITH EXPECTED VALUE

NON-VOLATILE MULTI-LEVEL SEMICONDUCTOR STORAGE DEVICE FOR STORING MULTIPLE BITS USING MULTIPLE VARIABLE THRESHOLD VOLTAGES

FIELD OF THE INVENTION

This invention relates to a multi-valued non-volatile semiconductor storage, and more particularly to, a non-volatile semiconductor storage that is electrically programmable and is adapted to storing data with four or more values into one memory cell.

BACKGROUND OF THE INVENTION

As a kind of electrically programmable non-volatile semiconductor memory, EEPROM (electrically erasable and programmable read only memory) and flash-type EEPROM are known.

FIG. 1 is a schematic sectional view showing a typical flash-type EEPROM. Referring to FIG. 1, a drain 101 and a source 102, both of which are of n-type impurity diffusion layer, are formed on the surface of a p-type silicon substrate 100, and a channel region 103 is defined therebetween. Also, a tunnel insulating film 104 of $SiO_2$ is formed on the channel region 103, and a floating gate 105, an interlayer insulating film 106 and a control gate 107 are formed thereon in this order. 108 is a bit line connected to the drain 101, and 109 is a source line.

In the write operation of a memory cell composed as above-mentioned, for example, the substrate 100 is grounded and voltages of 12V, 5V and 0V are applied to the control gate, drain 101 and source, respectively.

At this time, the potential of the floating gate 105 is increased due to the capacity coupling between the control gate 107 and the floating gate 105, and a channel is formed between the drain 101 and the source 102. High-energy electrons (hot electrons) generate around the drain 101 due to a high voltage of the control gate 107 and a voltage of the drain 101 and they are injected into the floating gate 105 beyond a potential barrier, e.g., 3.2 eV for electron, between the p-type silicon substrate 100 and the tunnel insulating film 104.

The electrons thus injected remain to be held therein even after turning the drain 101 and control gate 107 into open state because the floating gate is surrounded by oxide film with a low conductivity.

On the other hand, in the erase operation, for example, the control gate 107 is grounded and a voltage of 12V is applied to the source 102. Thereby, electrons are extracted from the floating gate 105 to reduce the threshold voltage. In this case, two states of threshold voltages are provided in the memory cell.

In writing binary data (data "0", "1" provided in one memory cell) in a memory cell, the collation judgement, i.e., judging whether the state of a memory cell (data "0" or "1") and write data are identical or not identical with each other, is conventionally conducted by using such a circuit as shown in FIG. 2. Referring to FIG. 2, the circuit comprises a NAND gate 7 that a signal fixed to a 'H' level in write operation and a write data signal are input, a NAND gate 8 that the output signal 3 of sense amplifier and the output signal 4 of the NAND gate 7 are input, and an exclusive-NOR (XNOR) gate 9. The output of the XNOR gate 9 is used as an output 6 of collation judgement result.

Referring to FIG. 3 that shows a threshold-voltage distribution for one bit, i.e., one binary data and FIG. 4 that is a flow chart showing a write operation flow, the operation of the conventional collation judgement circuit in FIG. 2 will be explained below. In FIG. 3 the axis of ordinates indicates a threshold voltage of memory cell and the axis of abscissas indicates a bit number with its threshold voltage. Here, an erase state (threshold voltage in memory cell is low) is defined by data "1", and a state that threshold voltage is raised is defined by data "0". "ref" is a reference voltage for judging which the threshold voltage in memory cell is "1" or "0". Which a memory cell selected has a threshold voltage of "1" or "0" is acknowledged by judging that it is higher or lower than the reference voltage.

Referring to FIG. 4, in write operation, for a selected memory cell, a sense amplifier outputs which a pre-write data (data before writing) in memory cell is data "0" (threshold voltage is high) or data "1" (threshold voltage is low) by comparing the memory cell with the reference. Then, a pre-write verifying for comparing with a write data is conducted (step S1). If the pre-write data is identical with the write data (refer to a branch "PASS" in step S1), then the collation judgement circuit outputs "H" (PASS). then proceeding to the write operation of the next address or to the next operation (step S6)

If the pre-write data is not identical with the write data in the write verifying, then outputting "L" (FAIL) as the collation judgement result, applying a write voltage to the selected memory cell (step S2) to raise the threshold voltage, comparing the memory cell after the write voltage application with the reference, outputting which it is data "0" or data "1", then conducting a post-write verifying for comparing with the write data (step S3). If "PASS", then proceeding to the write operation of the next address or to the next operation (step S6). on the other hand, if "FAIL", then judging whether the retrying number (circuit to be applied of write voltage) is "MAX" (maximum value) or not (step S4). If not "MAX" (a branch "NO" in step S4), returning to step S2, again applying the write voltage, conducting the post-write verifying. These steps are repeated until being judged as "PASS".

On the other hand, if the retrying number is "MAX" in step S4, then being regarded as a write error, ending the write operation (step S5).

In general, manufacturers ship products that all memory cells are erased, and its user operates to write a desired pattern in the memory cells. In writing a different pattern therein. the user operates to erase all the memory cells and then to write the different pattern. However, a user may need to write a different pattern adding to a written pattern of product (this operation is hereinafter referred to as 'over-write').

The over-write operation will be explained referring to FIG. 4. First, for a selected memory cell, a pre-write verifying is conducted. If not identical, then outputting "L" (FAIL) as the collation judgement result, and, if identical, then outputting "H" (PASS) as the collation judgement result. Also, if identical, the operation is ended without applying the write voltage to the memory cell.

If not identical, then applying the write voltage to the selected memory cell. conducting the post-write verifying, ending the operation when judged as "PASS".

When the judgement is "FAIL", again applying the write voltage, conducting the post-write verifying. These steps are repeated until the retrying number is "MAX".

FIG. 5 shows a judgement table used in the above-mentioned collation judgement. Referring to FIG. 5, when write data "1" is to be written in a memory cell with a pre-write data "0" that means a high threshold voltage, it is judged as "PASS". The reason is as follows: To turn a memory cell with data "0" into data "1", there is only one way that a block including the selected memory cell is erased to turn all the memory cells in the block into data "1". But, when such an erasing is conducted, all other written data in the memory cells must be changed in to data "1". As compared with a semiconductor storage that can write/erase each one memory cell, a non-volatile semiconductor storage is generally designed so that an erasing is conducted to a certain block e.g., 128 kbite, while a writing can be conducted to each one memory cell. Because of this, when data "1" is to be written in, the state of a memory cell before writing is not changed. Thus, when data "1 " is to be written in a memory cell with pre-write data "0", the data in the memory cell needs to be kept "0".

The operation of the circuit in FIG. 2 will be explained below.

A signal 1 is fixed to "H" when the write operation (from pre-write verifying until post-write verifying) is started. As a write data signal 2, "L" is input when data "0" is to be written in and "H" is input when data "1" is to be written in (when the state of a memory cell is desired to keep, i.e., not to conduct the writing). A sense amplifier signal 3 is a signal that is output detecting the state of a memory cell before writing by a sense amplifier. For example, it is "L" for a memory cell with data "1" and it is "H" for a memory cell with data "0". The signal flow until the output 6 of collation judgement result is as follows: When a write data is "0", the write data signal 2 is "H". Then, the output 4 of the NAND circuit 7 is "L", the output 5 of the NAND circuit 8 is "H", and the output of the XNOR circuit 9, i.e., the output 6 of the collation judgment result, is "H" (PASS) regardless of the output signal of the sense amplifier.

Next, when data "0" is to be written in a memory cell with pre-write data "0", the write data signal 2 is "L". Then, the output 4 of the NAND circuit 7 is "H", the output signal 3 of the sense amplifier is "H" for pre-write data "0", the output 5 of the NAND circuit 8 is "L", and the output 6 of the collation judgement result is "H" (PASS).

Finally, when data "0" is to be written in a memory cell with pre-write data "1", the write data signal 2 is "L". Then, the output 4 of the NAND circuit 7 is "H", the output signal 3 of the sense amplifier is "L" for pre-write data "1", the output 5 of the NAND circuit 8 is "H", and the output 6 of the collation judgement result is "L" (FAIL).

In this case, the write operation is proceeded to applying the write voltage to the selected memory cell, thereby raising the threshold voltage. Then, again conducting the collation judgement, when the output signal 3 becomes "H", by that the memory cell has a threshold voltage to data "0", the output 5 of the NAND circuit 8 is "L". Thereby, the output 6 of the collation judgement result becomes "H" (PASS).

As described above, in the collation judgement circuit in FIG. 2, when data "1" is to be written in a memory cell with pre-write data "0", the collation judgement result is output as "H" (PASS).

FIG. 6 shows another collation judgement circuit and FIG. 7 shows a judgement table used in this collation judgement circuit. Referring to FIG. 6. the circuit comprises a NAND gate 65 that a signal 60 fixed to "H" level in write operation and a write data signal 61 are input, and an exclusive-NOR (XNOR) circuit 66 that the output signal 62 of a sense amplifier and the output signal 63 of the NAND gate 65 are input. The output of the XNOR circuit 66 is used as an output 64 of collation judgement result.

In the circuit in FIG. 6, the write operation conducted when data "0" is to be written in a memory cell with pre-write data "0" and when data "0" or "1" is to be written in a memory cell with pre-write data "1" is similar to that of the circuit in FIG. 2. The explanation is therefore omitted.

On the other hand, as described earlier, data "1" cannot be written in a memory cell with pre-write data "0". In this case, it is processed as write error.

As explained above, the two types of collation judgement circuits that process such a case as write error and "PASS", respectively are known.

Recently, to realize a large-capacity semiconductor storage, it is proposed that several-bit data is assigned to one memory cell. In such a case, the memory cell needs to have several kinds of threshold-voltage states. For example, a case that two-bit data (quaternary data) is assigned to one memory cell will be explained below.

FIG. 8 shows a threshold-voltage distribution for ternary data. In FIG. 8, the axis of ordinates indicates a threshold voltage of memory cell and the axis of abscissas indicates a bit number with its threshold voltage. Here, an erase state (threshold voltage in memory cell is lowest) is defined by data "11", and states that threshold voltages are raised stepwise are defined by data "10", "01" and "00", whose threshold voltage is highest. "ref.1, 2 and 3" are reference voltages for judging which state the threshold voltage in memory cell belongs to. Which state of the four threshold-voltage states a memory cell selected belongs to is acknowledged by judging that its voltage is higher or lower than the different reference voltages.

The over-write operation of quaternary data by using the conventional circuit in FIG. 2 in the conventional manner that the collation judgment result is output as "PASS" when data "1" is to be written in a memory cell with pre-write data "0" will be explained below. FIG. 9 shows a judgement table used in the collation judgement.

The right-hand bit of data "11", "10", "01" or "00" is called 'low-order bit' and the left-hand bit thereof is called 'high-order bit'.

First, when data "11" is to be written, the collation judgement result is output as "H" (PASS) regardless of a pre-write data in pre-write verifying because pre-write data is to be kept unalteredly like the conventional manner.

Second, when data "10" is to be written in a memory cell with pre-write data "00", for the low-order bit that data "0" is to be written in data "0", the collation judgement result is "PASS", and, for the high-order bit that data "1" is to be written in data "0", the collation judgement result is "PASS". Thus, the pre-write verifying is ended outputting "PASS". Also, data "01" is processed in like manner.

Third, when data "10", "01" and "00" are to be written in a memory cell with pre-write data "10", "01" and "00", respectively, the pre-write verifying is ended outputting "PASS" because the high-order bit and low-order bit are identical with each other.

Fourth, when data "10", "01" and "00" are to be written in a memory cell with pre-write data "11", the pre-write verifying outputs "FAIL", then applying a write voltage to the memory cell to raise stepwise the threshold voltage, conducting the post-write verifying. When the threshold-voltage state corresponding to the respective write data in FIG. 8 is obtained by repeating these steps, the collation judgement result is ended outputting "PASS" (H).

Fifth, when data "00" is to be written in a memory cell with pre-write data "10" and "01", for the low-order bit or high-order bit, the pre-write verifying outputs "FAIL", then applying a write voltage to the memory cell to raise stepwise the threshold voltage, conducting the post-write verifying. When the threshold-voltage state corresponding to data "00" is obtained by repeating these steps, the collation judgement result is ended outputting "PASS" (H).

Sixth, when data "10" is to be written in a memory cell with pre-write data "01", for the low-order bit, the pre-write verifying outputs "FAIL", then applying a write voltage to the memory cell to raise stepwise the threshold voltage, conducting the post-write verifying. When the threshold-voltage state corresponding to data "00" is obtained by repeating these steps, the collation judgement result is ended outputting "PASS" (H).

Here, regarding the high-order bit, when "1" is to be written for pre-write data "0", the post-write data is allowed to be "0". Regarding the low-order bit, when "0" is to be written for pre-write data "1", the post-write data needs to be unalteredly "0". Thus, when "10" is to be written for pre-write data "01", the post-write needs to be "00". As a result, the writing can be conducted to be identical with the expected value.

Seventh, when data "01" is to be written in a memory cell with pre-write data "10", for the high-order bit, the pre-write verifying outputs "FAIL", then applying a write voltage to the memory cell to raise stepwise the threshold voltage, conducting the post-write verifying. Repeating these steps, when the threshold voltage of the memory cell is raised to a threshold voltage for data "01", the output signal 3 of sense amplifier of the collation judgement circuit in FIG. 2 outputs to be identical with the write data "01" according to the threshold-voltage relation in FIG. 8. Thereby, the output 6 of the collation judgement result is turned into "PASS". As a result, the post-write data becomes "01".

Here, in writing data "01" in a memory cell with pre-write data "10", regarding the high-order bit, when "0" is to be written for pre-write data "1", the post-write data becomes "0". As a result, the data are identical with each other. On the other hand, regarding the low-order bit, when "1" is to be written for pre-write data "0", the post-write data needs to be unalteredly "0". Thus, the post-write must be "00". However, in the collation judgement circuit in FIG. 2, the output 6 of collation judgement result must be output as "H" (PASS) at a threshold voltage for data "01" and the writing is then ended.

Thus, there is a problem that a compatibility with binary data cannot be obtained.

Meanwhile, in the conventional collation judgement circuit in FIG. 6 that a write error is issued when data "1" is to be written in a memory cell with pre-write data "0", a write error is issued when the pre-write data and write data are not identical with each other. Therefore, such a problem does not occur.

SUMMARY OF THE INVENTION

Accordingly, it is an object of the invention to provide a non-volatile semiconductor storage to store several-bit data that has a compatibility with a binary collation judgement manner in overwriting.

According to the invention, non-volatile semiconductor storage, comprises:
  a memory cell to store m or more bits (m≧2) data and to be given of n kinds (n≧4) of threshold voltages by raising its threshold voltage in writing;
  wherein, when a write data "1" is to be written in the memory cell that a k bit of m bits (1≦k≦m) in a pre-write data has "0", the write data is converted into data "0".

According to another aspect of the invention, a non-volatile semiconductor storage, comprises:
  a memory cell to store m or more bits (m≧2) data and to be given of n kinds (n≧4) of threshold voltages by raising its threshold voltage in writing;
  wherein, when a write data "1" is to be written in the memory cell that a k bit of m bits (1≦k≦m) in a pre-write data has "0", the write data is converted into data "0" by using the write data "1" and an output signal of sense amplifier.

According to another aspect of the invention. a non-volatile semiconductor storage, comprises:
  a memory cell to store m or more bits (m≧2) data and to be given of n kinds (n≧4) of threshold voltages by reducing its threshold voltage in writing;
  wherein, when a write data "1" is to be written in the memory cell that a k bit of m bits (1≦k≦m) in a pre-write data has "0", the write data is converted into data "0".

According to another aspect of the invention, a non-volatile semiconductor storage, comprises:
  a memory cell to store m or more bits (m≧2) data and to be given of n kinds (n≧4) of threshold voltages by reducing its threshold voltage in writing;
  wherein, when a write data "1" is to be written in the memory cell that a k bit of m bits (1≦k≦m) in a pre-write data has "0", the write data is converted into data "0", by using the write data "1" and an output signal of sense amplifier.

According to another aspect of the invention, a non-volatile semiconductor storage, comprises:
  a memory cell to store m or more bits (m≧2) data and to be given of n kinds (n≧4) of threshold voltages by raising or reducing its threshold voltage in writing; and
  a collation judgement circuit that, in over writing multi-valued data, instead of outputting "PASS" when a write data "1" is to be written in the memory cell with a pre-write data "0", the write data is written being converted into data "0" by using the write data "1" and an output signal of sense amplifier, whereby the collation judgement circuit has a compatibility with a binary collation judgement manner that, when data "0" is to be written for a pre-write data "0", the pre-write data "0" is unalteredly kept.

BRIEF DESCRIPTION OF THE DRAWINGS

The invention will be explained in more detail in conjunction with the appended drawings, wherein:
FIG. 5 is a judgement table for binary data used in the conventional collation judgement circuit in FIG. 2,
FIG. 7 is a judgement table for binary data used in the conventional collation judgement circuit in FIG. 6,
FIG. 9 is a judgement table for quaternary data used in the conventional collation judgement circuit in FIG. 2,
FIG. 11 is a judgement table for quaternary data used in the collation judgement circuit in FIG. 10.

DESCRIPTION OF THE PREFERRED EMBODIMENTS

A non-volatile semiconductor storage according to the invention is will be explained below. In this non-volatile semiconductor storage comprising a memory cell to store two or more bits data and to be given of four or more kinds of threshold voltages by raising its threshold voltage in writing, to match with the binary collation judgement manner in overwriting, when writing data "1", a write data is written converting into "0" by using an output signal of sense amplifier and the write data, thereby the writing can be conducted along its expected value.

In case of quaternary data, in multi-valued data overwriting, where the collation judgement circuit outputs "PASS" when writing data "1" in a memory cell with a pre-write data "0", the write operation is conducted by converting write data "01" into "00" when writing data "01" in a memory cell with pre-write data "10", thereby obtaining the expected value "00" in writing data "01" for pre-write data "10". Therefore, it can have a compatibility with binary collation judgement manner that, when data "1" is to be written for a pre-write data "0", the pre-write data "0" is unalteredly kept.

Thus, when data "1" is to be written, the write data is written converting by using the pre-write data and sense amplifier's output signal. Thereby, the compatibility with binary overwriting can be obtained.

Figure 10:
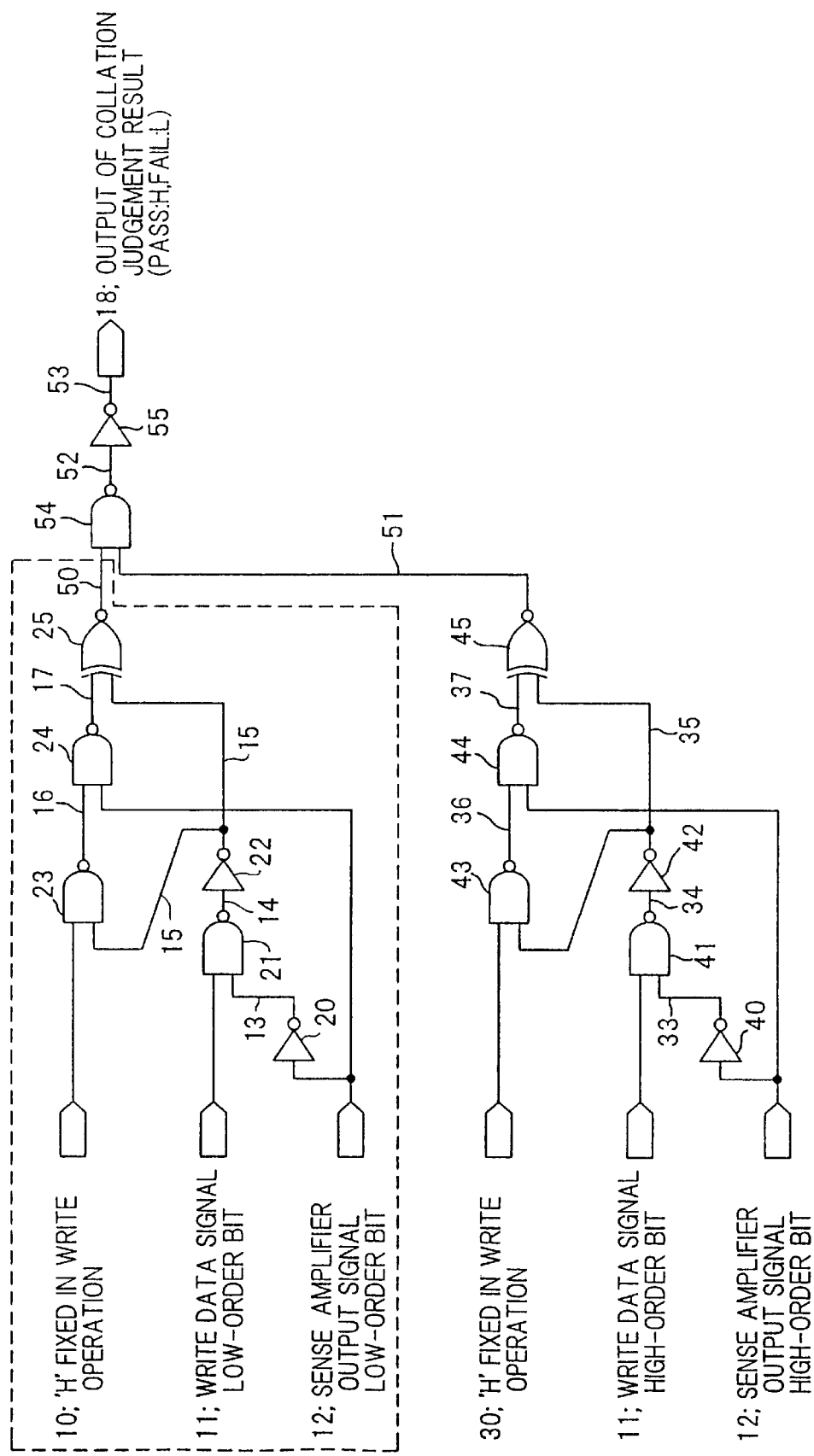
FIG. 10 is a block diagram showing a collation judgement circuit for quaternary data to be used in a non-volatile semiconductor storage in a preferred embodiment according to the invention.

Referring to FIGS. 10 and 11, an embodiment according to the invention will be explained below. This embodiment is an example that two-bit data (quaternary data) is to be stored in one memory cell.

FIG. 10 shows a collation judgement circuit for quaternary data used in this embodiment, and FIG. 11 shows a judgement table used in the write operation using the collation judgement circuit.

Referring to FIG. 10, the collation judgement circuit in the embodiment comprises: for low-order bit, a NAND circuit 23 that has an input port to input a signal fixed to "H" in write operation and another input port to input an inverted signal 15 by an inverter 22 of the output of a NAND circuit 21 to input a write data signal (low-order bit) 11 and a inverted signal by an inverter 20 of a sense amplifier's output signal 12 (low-order bit); a NAND circuit 24 to input an output 16 of the NAND circuit 23 and the sense amplifier's output signal 12; and an exclusive-NOR (XNOR) circuit 25 to input an output 17 of the NAND 24 and the output 15 of the inverter 22. It further comprises: for high-order bit, a NAND circuit 43 that has an input port to input a signal fixed to "H" in write operation and another input port to input an inverted signal 35 by an inverter 42 of the output of a NAND circuit 41 to input a write data signal (high-order bit) 31 and a inverted signal by an inverter 40 of a sense amplifier's output signal 32 (high-order bit); a NAND circuit 44 to input an output 36 of the NAND circuit 43 and the sense amplifier's output signal 32; and an exclusive-NOR (XNOR) circuit 45 to input an output 37 of the NAND 44 and the output 35 of the inverter 42. Also, it comprises a NAND circuit 54 to input the output of the XNOR circuits 25, 45, and an inverter 55 to invert an output 52 of the NAND circuit 54. An output 53 of the inverter 55 is used as an output 18 of collation judgement result ("H" for "PASS", "L" for "FAIL").

In this embodiment, by converting a write data at the collation judgement circuit from the write data and a sense amplifier's output signal. the over-write operation can be conducted along an expected value. Herein, a converted write data is referred to as 'WD'.

First, when data "10", "01" and "00" are to be written in a memory cell with pre-write data "11", the write data WD after converting are "10", "01" and "00", respectively. The pre-write verifying outputs "FAIL", then applying a write voltage to the memory cell to raise stepwise the threshold voltage, conducting the post-write verifying. When the threshold-voltage state, corresponding to the write data is obtained by repeating these steps, the collation judgement result outputs "PASS", then ending the write operation.

Second, when data "11" is to be written in a memory cell with pre-write data "10", the write data WD after converting is "10". The pre-write verifying outputs "PASS", then ending the write operation. Similarly, when data "11" is to be written in a memory cell with pre-write data "01", the write data WD after converting is "01". The pre-write verifying outputs "PASS", then ending the write operation. Also, when data "11" is to be written in a memory cell with pre-write data "00", the write data WD after converting is "00". The pre-write verifying outputs "PASS", then ending the write operation.

Third, when data "11" is to be written in a memory cell with pre-write data "11", the write data WD after converting is "11". When data "10" is to be written in a memory cell with pre-write data "10", the write data WD after converting is "10". When data "01" is to be written in a memory cell with pre-write data "01", the write data WD after converting is "01". When data "00" is to be written in a memory cell with pre-write data "00", the write data WD after converting is "00". In these cases, the pre-write verifying outputs "PASS", then ending the write operation.

Fourth, when data "10" or "01" is to be written in a memory cell with pre-write data "00", the write data WD after converting is "00". The pre-write verifying outputs "PASS", then ending the write operation.

Fifth, when data "00" is to be written in a memory cell with pre-write data "10", the write data WD after converting is "00". When data "00" is to be written in a memory cell with pre-write data "01", the write data WD after converting is "00". Then, applying a write voltage to the memory cell to raise stepwise the threshold voltage, conducting the post-write verifying. When the threshold-voltage state corresponding to the write data "00" is obtained by repeating these steps, the collation judgement result outputs "PASS", then ending the write operation.

Sixth, when data "10" is to be written in a memory cell with pre-write data "01", the write data WD after converting is "00". When the threshold-voltage state corresponding to the write data "00" is obtained, the collation judgement result outputs "PASS", then ending the write operation. Here, an expected value in writing data "10" for pre-write data "01" is to be "00", thus the writing has been conducted along the expected value. Also, when data "01" is to be written in a memory cell with pre-write data "10", the write data WD after converting is "00". When the threshold-voltage state corresponding to the write data "00" is obtained, the collation judgement result outputs "PASS", then ending the write operation.

Figure 1:
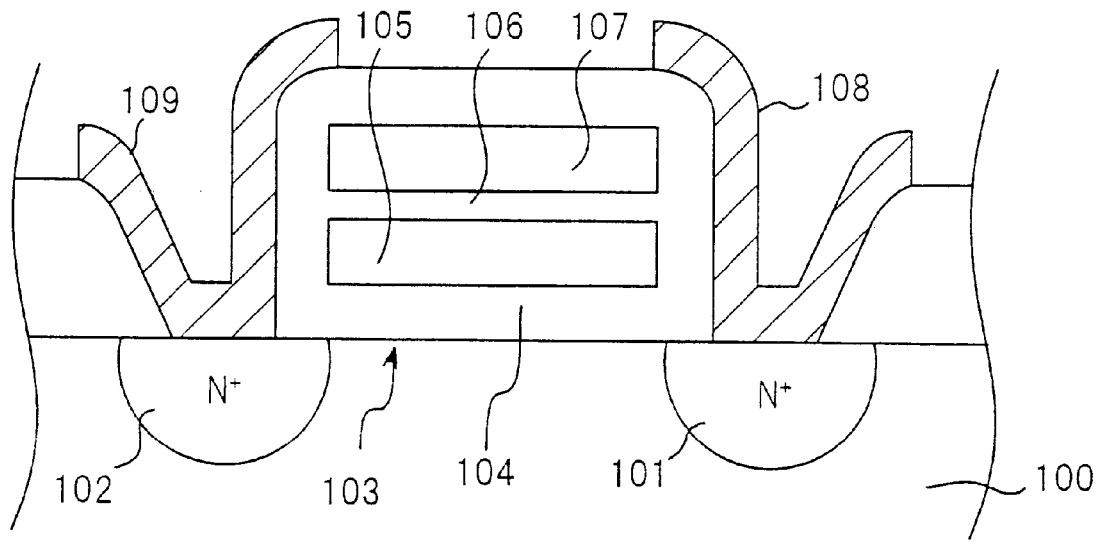
FIG. 1 is a schematic cross sectional view showing a conventional EEPROM memory cell.
Figure 2:
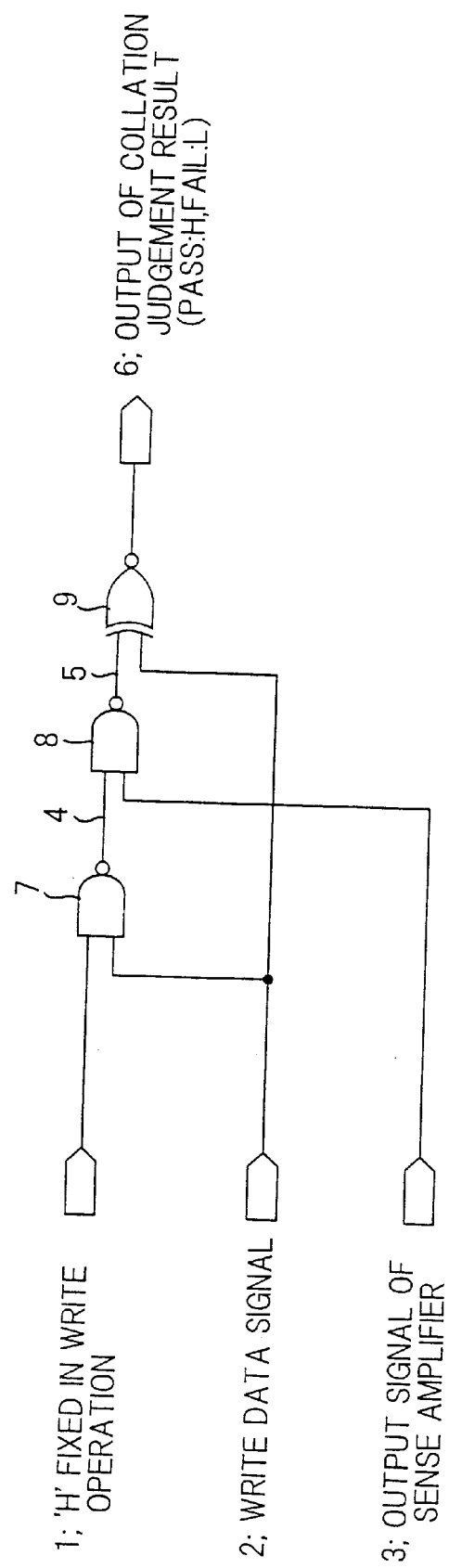
FIG. 2 is a block diagram showing a conventional collation judgement circuit.
Figure 3:
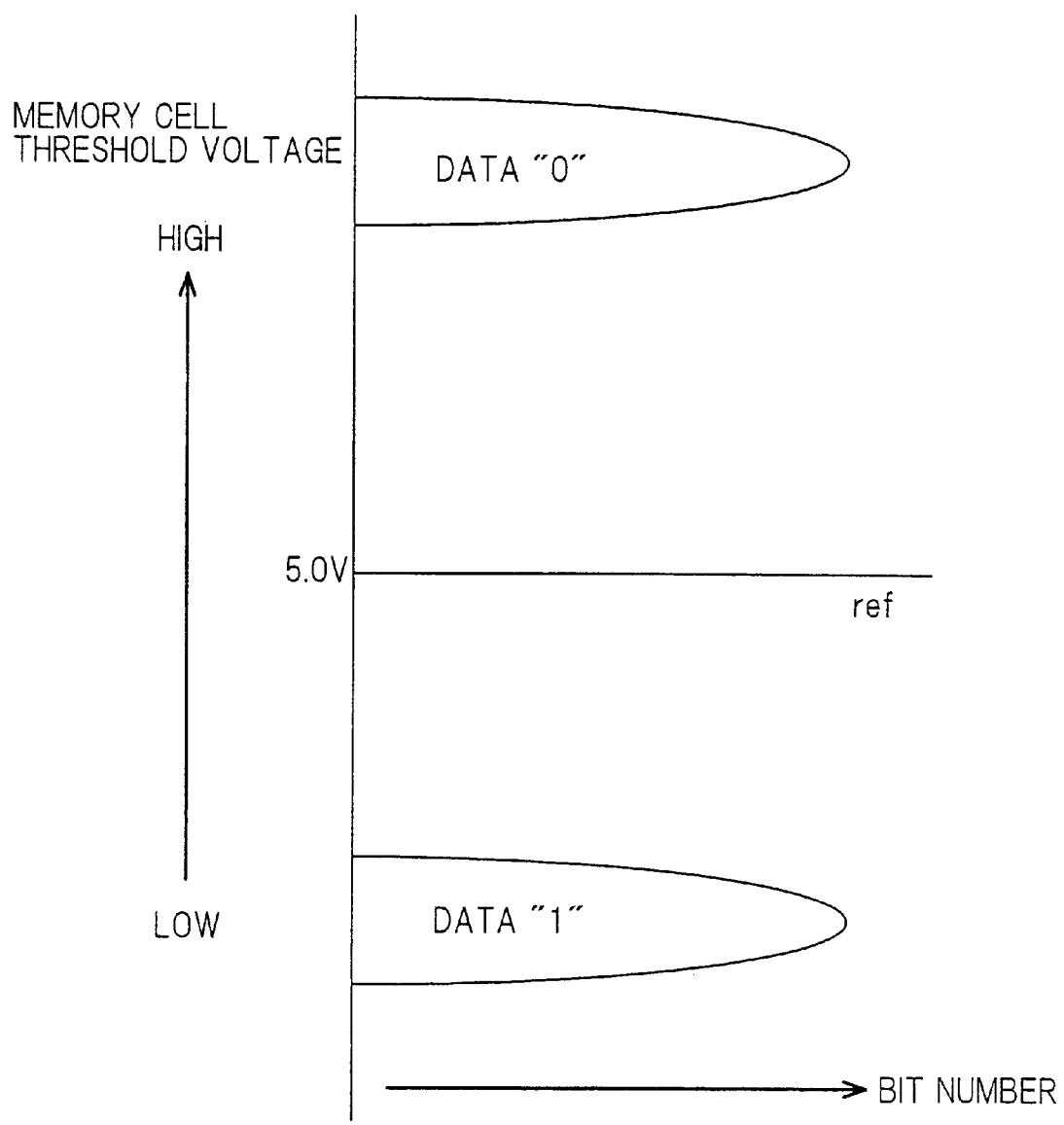
FIG. 3 is an illustration showing a binary threshold voltage distribution.
Figure 4:
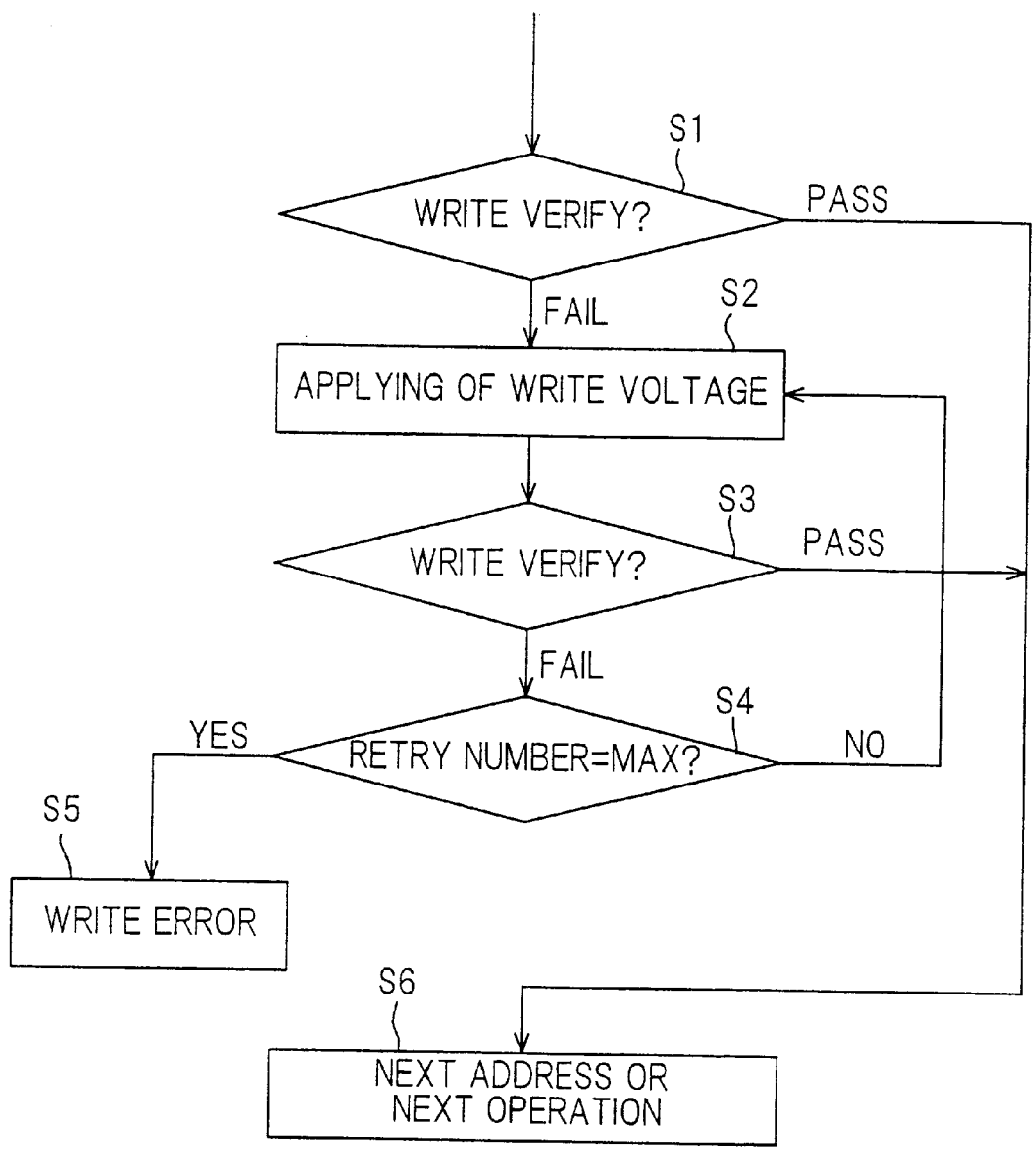
FIG. 4 is a flow chart showing a conventional write operation.
Figure 6:
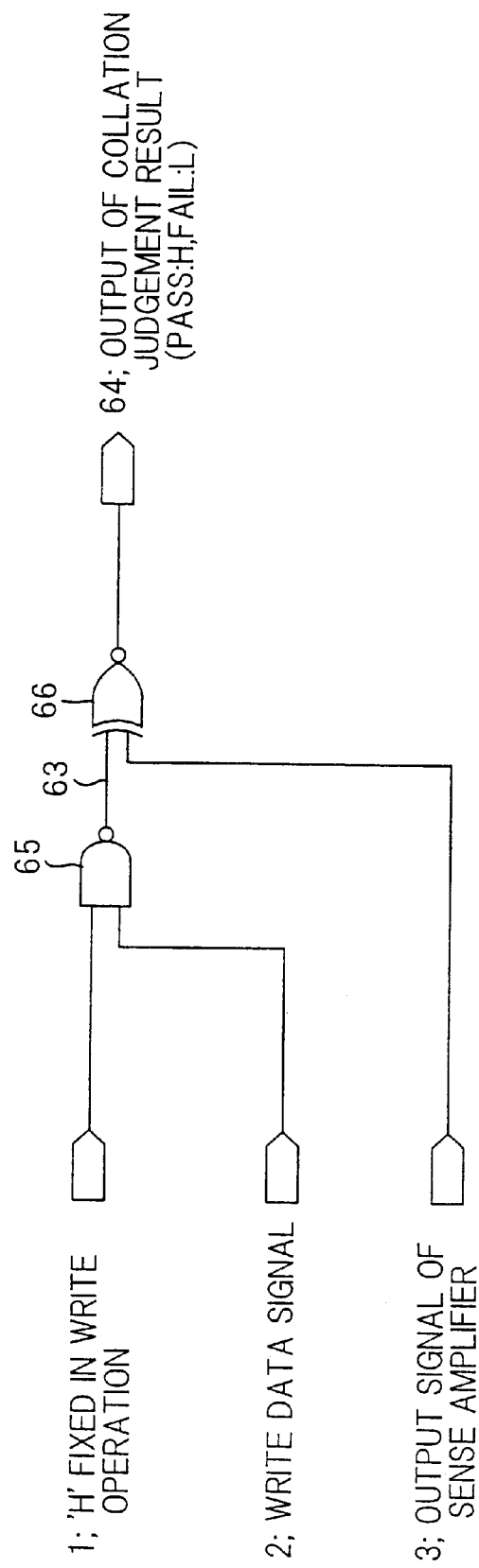
FIG. 6 is a block diagram showing another conventional collation judgement circuit.
Figure 8:
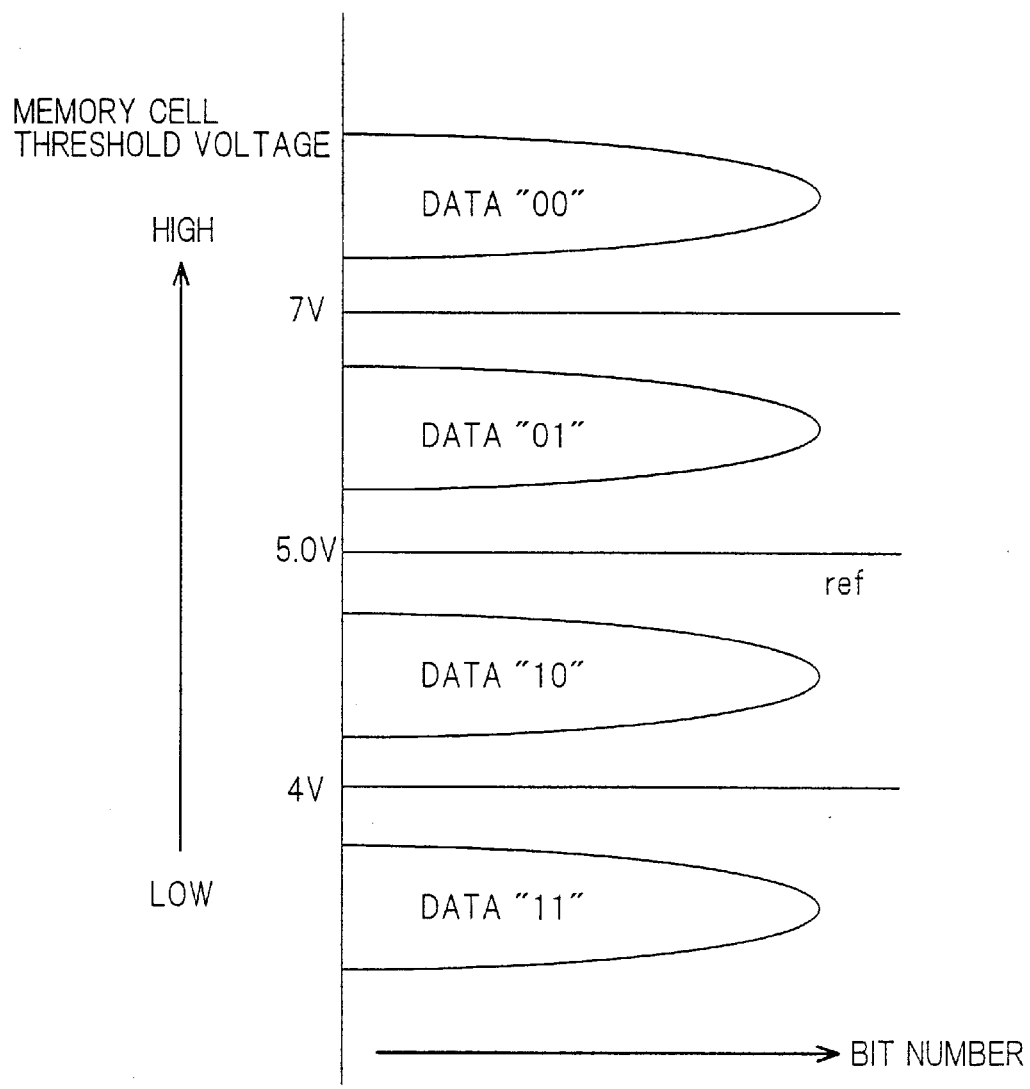
FIG. 8 is an illustration showing a quaternary threshold voltage distribution.

Meanwhile, in the conventional circuit in FIG. 2, in writing data "01" for pre-write data "10", the write operation must be ended when reaching data "01". However, in this embodiment, the write operation continues until reaching data "00", thereby the data along the expected value can be obtained.

Next, regarding a part surrounded by dotted line of the collation judgement circuit for quaternary data in FIG. 10, i.e., one-bit part, the circuit operation will be detailed below.

When write data "0", i.e., "L" is input, the output 14 of the NAND circuit 21 is "H" and then the output 15 of the inverter 22 is "L". This signal corresponds to write data "0" after converting.

Then, the output 16 of the NAND circuit 23 by which the output 15 of the inverter 22 is received is "H". The output of the NAND circuit 24 is varied depending on the output signal 12 of sense amplifier. This means that, when the output signal 12 of sense amplifier is "H", i.e., when the memory cell has data "0", the output 17 of the NAND circuit 24 becomes "L", thus the output 50 of collation judgement result is output as "H" (PASS).

Therefore, for the memory cell with pre-write data "0", the pre-write verifying outputs "PASS", then ending the write operation.

Also, for pre-write data "1", the pre-write verifying outputs "FAIL", then applying a write voltage to the memory cell to raise the threshold voltage. When the output signal 12 of sense amplifier is inverted from "L" to "H", the collation judgement result outputs "PASS", then ending the write operation.

On the other hand, when write data "1", i.e., "H" is input, the output 14 of the NAND circuit 21 depends on the output signal 12 of sense amplifier. For pre-write data "1", the output signal 12 of sense amplifier is "L", thus the output signal 13 of the inverter 20 is "H" and then the output 14 of the NAND circuit 21 is "L". Therefore, the signal 15 as write data after converting becomes "H", i.e., data "1".

For pre-write data "0", the output signal 12 of sense amplifier is "H", thus the output signal 13 of the inverter 20 is "L" and then the output 14 of the NAND circuit 21 is "H". Therefore, the signal 15 as write data after converting becomes "L", i.e., data "0".

Thus, when data "1" is to be written in a memory cell with pre-write data "0", the write data can be converted into "0".

Accordingly, in the embodiment, by using the collation judgement circuit for quaternary data in FIG. 10, when data "01" is to be written in a memory cell with pre-write data "10", the write data can be converted into "00". Thus, the writing can be conducted along the expected value.

Meanwhile, in the embodiment, the non-volatile semiconductor storage to be given of quaternary threshold voltages by raising the threshold voltage in writing was explained. However, it may be given of quaternary threshold voltages by reducing the threshold voltage in writing.

Also, the collation judgement manner used in the invention can be applied to a non-volatile semiconductor storage to store n-bit (n≧2) data, other than quaternary data, in one memory cell.

In this embodiment, a channel hot-electron injection type memory cell for writing is used. However, various kinds of memory cells, e.g., F-N (Fowler-Nordheim) tunneling type, can be applied for both writing and erasing.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed is:

1. A non-volatile semiconductor storage, comprising:
    a memory cell operative to store m or more bits (m≧2) data and to respond to the application of n kinds (n≧4) of threshold voltages by raising its threshold voltage in a writing operation;
    wherein, when a write data "1" is to be written in said memory cell that a k bit of m bits (1≦k≦m) in a pre-write data has "0", said write data is converted into data "0".

2. A non-volatile semiconductor storage, comprising:
    a memory cell operative to store m or more bits (m≧2) data and to respond to the application of n kinds (n≧4) of threshold voltages by raising its threshold voltage in a writing operation;
    wherein, when a write data "1" is to be written in said memory cell that a k bit of m bits (1≦k≦m) in a pre-write data has "0", said write data is converted into data "0" by using said write data "1" and an output signal of a sense amplifier.

3. A non-volatile semiconductor storage, comprising:
    a memory cell operative to store m or more bits (m≧2) data and to respond to the application of n kinds (n≧4) of threshold voltages by reducing its threshold voltage in a writing operation;
    wherein, when a write data "1" is to be written in said memory cell that a k bit of m bits (1≦k≦m) in a pre-write data has "0", said write data is converted into data "0".

4. A non-volatile semiconductor storage, comprising:
    a memory cell operative to store m or more bits (m≧2) data and to respond to the application of n kinds (n≧4) of threshold voltages by reducing its threshold voltage in a writing operation;
    wherein, when a write data "1" is to be written in said memory cell that a k bit of m bits (1≦k≦m) in a pre-write data has "0", said write data is converted into data "0" by using said write data "1" and an output signal of a sense amplifier.

5. A non-volatile semiconductor storage, comprising:
    a memory cell operative to store m or more bits (m≧2) data and to respond to the application of n kinds (n≧4) of threshold voltages by raising or reducing its threshold voltage in a writing operation; and
    a collation judgement circuit that, in overwriting multi-valued data, instead of outputting "PASS" when a write data "1" is to be written in said memory cell when it has a pre-write data "0", said write data is written by being converted into data "0" by using said write data "1" and an output signal of a sense amplifier, whereby said collation judgement circuit has a compatibility with a binary collation judgement procedure such that, when data "1" is to be written for a pre-write data "0", said pre-write data "0" is unalteredly kept.

6. A non-volatile semiconductor storage, comprising:
    a memory cell operative to store m or more bits (m≧2) of data and responsive to n levels (n≧4) of threshold voltage by one of raising and lowering its threshold voltage in performing a write operation; and
    a collation judgment means comprising a first circuit, responsive to at least a low order bit of a write data signal and a low order bit of a sense amplifier for generating a first signal, said first signal representing a conversion of a write data from a representation of a 1 to a 0 when said sense amplifier output reflects a stored value of 0, a second circuit responsive to at least a higher order bit of a write data signal and a higher order bit of a sense amplifier for generating a second signal, and third means responsive to said first signal and said second signal for issuing one of a PASS or FAIL judgment.

7. A non-volatile semiconductor storage, comprising:

a memory cell operative to store m or more bits (m≧2) of data and responsive to n levels (n≧4) of threshold voltage by one of raising and lowering its threshold voltage in performing a write operation; and a collation judgment means comprising a circuit responsive to at least a low order bit of a write data signal and a low order bit of a sense amplifier for generating a data conversion signal, said data conversion signal representing a conversion of a write data from a representation of a 1 to a 0 when said sense amplifier output reflects a stored value of 0.

8. A non-volatile semiconductor storage, comprising:

a memory cell operative to store m or more bits (m≧2) of data and responsive to n levels (n≧4) of threshold voltage by one of raising and lowering its threshold voltage in performing a write operation; and a collation judgment means comprising a first means responsive to a low order bit of a write data signal and a low order bit of a sense amplifier for generating a first signal, said first signal representing a conversion of a write data from a representation of a 1 to a 0 when said sense amplifier output reflects a stored value of 0 and a second means responsive to a higher order bit of a write data signal and a higher order bit of a sense amplifier for generating a second signal, said collation judgment means operative to respond to all input signals with either one of a PASS or FAIL judgment.

9. A non-volatile semiconductor storage, comprising:

a memory cell means for storing m or more bits (m≧2) of data, said memory cell means being responsive to n levels (n≧4) of threshold voltage by one of raising or reducing its threshold voltage during the performance of a write operation; and wherein, when a write data "1" is to be written in said memory cell means such that a k bit of m bits (1≦k≦m) in a pre-write data has "0", said write data is converted into data "0" by using said write data "1" and an output signal of a sense amplifier.

10. A non-volatile semiconductor storage, comprising:

a memory cell operative to store m or more bits (m≧2) of data and responsive to n levels (n≧4) of threshold voltage by raising or reducing its threshold voltage in performing a write operation; and a collation judgement means outputting a PASS or FAIL signal in response to an overwrite of a stored signal with write data, said means operative to convert said write data into data "0" by using said write data "1" and an output signal of a sense amplifier, whereby when data "1" is to be written for a pre-write data "0", said pre-write data "0" is unalteredly kept.

* * * * *

UNITED STATES PATENT AND TRADEMARK OFFICE
CERTIFICATE OF CORRECTION

PATENT NO. : 6,026,015
DATED : February 15, 2000
INVENTOR(S) : Tsuyoshi Hirakawa It is certified that error appears in the above-indentified patent and that said Letters Patent is hereby corrected as shown below:

Column 3, line 29 delete "0", insert --1--
Column 6, line 43 delete "0", insert --1--

Signed and Sealed this

Twentieth Day of March, 2001

Attest:

NICHOLAS P. GODICI

Attesting Officer        Acting Director of the United States Patent and Trademark Office